(12) United States Patent
Birnstock et al.

(10) Patent No.: US 8,569,743 B2
(45) Date of Patent: Oct. 29, 2013

(54) LIGHT-EMITTING COMPONENT

(75) Inventors: Jan Birnstock, Dresden (DE); Jan Blochwitz-Nimoth, Dresden (DE)

(73) Assignee: Novaled AG, Dresden (DE)

( * ) Notice: Subject to any disclaimer, the term of this patent is extended or adjusted under 35 U.S.C. 154(b) by 563 days.

(21) Appl. No.: 12/297,506

(22) PCT Filed: Apr. 13, 2007

(86) PCT No.: PCT/EP2007/003311
§ 371 (c)(1),
(2), (4) Date: Apr. 3, 2009

(87) PCT Pub. No.: WO2007/121877
PCT Pub. Date: Nov. 1, 2007

(65) Prior Publication Data
US 2010/0065825 A1    Mar. 18, 2010

(30) Foreign Application Priority Data

Apr. 19, 2006  (EP) .................................... 06008082
May 5, 2006   (EP) .................................... 06009302

(51) Int. Cl.
    *H01L 29/08*    (2006.01)
(52) U.S. Cl.
    USPC ...................... 257/40; 257/E51.022; 428/690
(58) Field of Classification Search
    USPC ..................... 257/40, E51.022; 428/688–703
    See application file for complete search history.

(56) References Cited

U.S. PATENT DOCUMENTS

| 4,356,429 | A | 10/1982 | Tang |
| 4,769,292 | A | 9/1988 | Tang et al. |

(Continued)

FOREIGN PATENT DOCUMENTS

| CA | 2549309 | 9/2005 |
| DE | 19916745 | 10/2000 |

(Continued)

OTHER PUBLICATIONS

Adachi, C. et al., "Efficient electrophosphorescence using a doped ambipolar conductive molecular organic thin film," Organic Electronics 2, (2001), pp. 37-43.

(Continued)

*Primary Examiner* — Shaun Campbell
(74) *Attorney, Agent, or Firm* — Sutherland Asbill & Brennan, LLP

(57) ABSTRACT

The invention relates to a light-emitting device, in particular a light-emitting diode, with an arrangement of layers on a substrate, wherein the arrangement of layers has an anode contact and a cathode contact which are in electrical contact with a light-emitting layer stack arranged between the anode contact and the cathode contact which, on its part, comprises a polymer layer consisting of a polymer material and a low-molecular layer of vacuum-deposited small molecules of an organic material, and wherein the small molecules of the low-molecular layer are formed as donor molecules with an oxidation potential versus Fc/Fc$^+$ (ferrocene/ferrocenium redox couple) of maximum approx. −1.5 V, if the low-molecular layer is arranged adjacent to the cathode contact, and as acceptor molecules with a reduction potential versus Fc/Fc$^+$ (ferrocene/ferrocenium redox couple) of minimum approx. −0.3 V if the low-molecular layer is arranged adjacent to the anode contact.

34 Claims, 1 Drawing Sheet

(56) References Cited

U.S. PATENT DOCUMENTS

Figure 1:
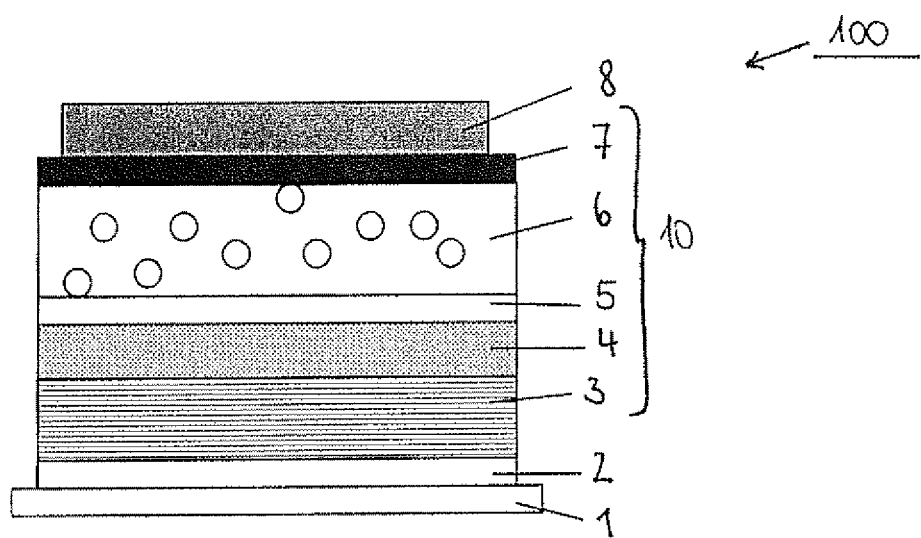

| | | | |
|---|---|---|---|
| 5,093,698 A | 3/1992 | Egusa | |
| 5,500,537 A | 3/1996 | Tsumura et al. | |
| 5,703,436 A | 12/1997 | Forrest et al. | |
| 5,757,026 A | 5/1998 | Forrest et al. | |
| 5,811,833 A | 9/1998 | Thompson | |
| 5,840,217 A | 11/1998 | Lupo et al. | |
| 5,849,403 A | 12/1998 | Aoki et al. | |
| 5,917,280 A | 6/1999 | Burrows et al. | |
| 5,943,154 A | 8/1999 | Nakayama | |
| 5,969,474 A | 10/1999 | Arai | |
| 5,989,785 A | 11/1999 | Ishihara et al. | |
| 6,023,073 A | 2/2000 | Strite | |
| 6,107,734 A | 8/2000 | Tanaka et al. | |
| 6,274,980 B1 | 8/2001 | Burrows et al. | |
| 6,303,238 B1 | 10/2001 | Thompson et al. | |
| 6,310,360 B1 | 10/2001 | Forrest et al. | |
| 6,337,492 B1 | 1/2002 | Jones et al. | |
| 6,406,804 B1 | 6/2002 | Higashi | |
| 6,437,769 B1 | 8/2002 | Kohayashi | |
| 6,555,840 B1 | 4/2003 | Hudson et al. | |
| 6,566,807 B1 | 5/2003 | Fujita et al. | |
| 6,573,651 B2 | 6/2003 | Adachi et al. | |
| 6,579,422 B1 | 6/2003 | Kasinuma | |
| 6,580,027 B2 | 6/2003 | Forrest et al. | |
| 6,589,673 B1 | 7/2003 | Kido et al. | |
| 6,645,645 B1 | 11/2003 | Adachi et al. | |
| 6,720,573 B2 | 4/2004 | Son | |
| 6,734,457 B2 | 5/2004 | Yamazaki | |
| 6,835,470 B1 | 12/2004 | Magain | |
| 6,867,538 B2 | 3/2005 | Adachi et al. | |
| 6,878,297 B1 | 4/2005 | Berger | |
| 6,897,473 B1 | 5/2005 | Burroughes et al. | |
| 6,900,588 B2 | 5/2005 | Adachi et al. | |
| 6,908,783 B1 | 6/2005 | Kuehl et al. | |
| 6,911,666 B2 | 6/2005 | Voutsas | |
| 6,933,522 B2 | 8/2005 | Lin | |
| 6,936,961 B2 | 8/2005 | Liao et al. | |
| 6,965,197 B2 | 11/2005 | Tyan | |
| 6,979,414 B2 | 12/2005 | Hosokawa et al. | |
| 7,001,536 B2 | 2/2006 | Thompson et al. | |
| 7,074,500 B2 | 7/2006 | Pfeiffer | |
| 7,161,292 B2 | 1/2007 | Leo | |
| 7,301,167 B2 | 11/2007 | Ko | |
| 7,355,197 B2 | 4/2008 | Blochwitz-Nimoth et al. | |
| 7,473,410 B1 | 1/2009 | Huffman et al. | |
| 2001/0033136 A1 | 10/2001 | Kawase | |
| 2002/0030440 A1 | 3/2002 | Yamazaki | |
| 2002/0041975 A1 | 4/2002 | Ueda et al. | |
| 2002/0048688 A1 | 4/2002 | Fukuoka et al. | |
| 2002/0071082 A1 | 6/2002 | Okita et al. | |
| 2002/0084993 A1 | 7/2002 | Taneya | |
| 2002/0098379 A1 | 7/2002 | Arakane | |
| 2002/0109136 A1 | 8/2002 | Seo et al. | |
| 2003/0020073 A1 | 1/2003 | Long et al. | |
| 2003/0042848 A1 | 3/2003 | Park et al. | |
| 2003/0052616 A1 | 3/2003 | Antoniadis et al. | |
| 2003/0098946 A1 | 5/2003 | Blaessing et al. | |
| 2003/0127973 A1 | 7/2003 | Weaver et al. | |
| 2003/0146443 A1 | 8/2003 | Yamazaki et al. | |
| 2003/0170491 A1 | 9/2003 | Liao et al. | |
| 2003/0178619 A1 | 9/2003 | Forrest et al. | |
| 2003/0189401 A1 | 10/2003 | Kido et al. | |
| 2003/0230980 A1 | 12/2003 | Forrest et al. | |
| 2004/0012980 A1 | 1/2004 | Sigiura et al. | |
| 2004/0032220 A1 | 2/2004 | Cok et al. | |
| 2004/0062949 A1 | 4/2004 | Pfeiffer et al. | |
| 2004/0067324 A1 | 4/2004 | Lazarev et al. | |
| 2004/0104394 A1 | 6/2004 | Lin et al. | |
| 2004/0113547 A1 | 6/2004 | Son | |
| 2004/0119400 A1 | 6/2004 | Takahashi et al. | |
| 2004/0150330 A1 | 8/2004 | Suh | |
| 2004/0183067 A1 | 9/2004 | Strip | |
| 2004/0191952 A1 | 9/2004 | Shtein et al. | |
| 2004/0201018 A1 | 10/2004 | Yamahara et al. | |
| 2004/0214041 A1 | 10/2004 | Lu et al. | |
| 2004/0227460 A1 | 11/2004 | Liao et al. | |
| 2004/0235209 A1 | 11/2004 | Hasegawa et al. | |
| 2004/0251816 A1 | 12/2004 | Leo et al. | |
| 2005/0029933 A1 | 2/2005 | Liao et al. | |
| 2005/0040390 A1 | 2/2005 | Pfeiffer et al. | |
| 2005/0040392 A1 | 2/2005 | Wu et al. | |
| 2005/0053801 A1 | 3/2005 | Eischner et al. | |
| 2005/0061232 A1 | 3/2005 | Werner et al. | |
| 2005/0073251 A1 | 4/2005 | Kato | |
| 2005/0086251 A1 | 4/2005 | Hatscher et al. | |
| 2005/0095736 A1 | 5/2005 | Padiyath et al. | |
| 2005/0110009 A1* | 5/2005 | Blochwitz-Nimoth et al. | 257/40 |
| 2005/0118745 A1 | 6/2005 | Yamazaki et al. | |
| 2005/0173700 A1 | 8/2005 | Liao et al. | |
| 2005/0189875 A1 | 9/2005 | Nakada | |
| 2005/0218797 A1 | 10/2005 | Bechtel et al. | |
| 2005/0236973 A1 | 10/2005 | Leo et al. | |
| 2005/0255334 A1 | 11/2005 | Kang et al. | |
| 2005/0269943 A1 | 12/2005 | Hack et al. | |
| 2005/0270279 A1 | 12/2005 | Giraldo et al. | |
| 2006/0033115 A1 | 2/2006 | Blochwitz et al. | |
| 2006/0038170 A1 | 2/2006 | Brunschwiler et al. | |
| 2006/0061266 A1 | 3/2006 | Kang et al. | |
| 2006/0065904 A1 | 3/2006 | Uemura et al. | |
| 2006/0145365 A1 | 7/2006 | Halls et al. | |
| 2006/0202196 A1 | 9/2006 | Kawakami et al. | |
| 2006/0231843 A1 | 10/2006 | Qin et al. | |
| 2006/0232992 A1 | 10/2006 | Bertram et al. | |
| 2006/0238112 A1 | 10/2006 | Kasama et al. | |
| 2006/0250076 A1 | 11/2006 | Hofmann et al. | |
| 2006/0273310 A1 | 12/2006 | Birnstock et al. | |
| 2007/0034860 A1 | 2/2007 | Nakamura | |
| 2007/0051946 A1 | 3/2007 | Walzer et al. | |
| 2007/0228360 A1* | 10/2007 | Zhu et al. | 257/40 |
| 2007/0278479 A1 | 12/2007 | Werner et al. | |
| 2008/0143250 A1 | 6/2008 | Blochwitz-Nimoth et al. | |
| 2008/0164807 A1 | 7/2008 | Hofmann et al. | |
| 2008/0203406 A1 | 8/2008 | He et al. | |
| 2008/0217580 A1 | 9/2008 | Tanabe et al. | |
| 2009/0009071 A1 | 1/2009 | Murano et al. | |
| 2009/0009072 A1 | 1/2009 | Wellmann et al. | |

FOREIGN PATENT DOCUMENTS

| | | |
|---|---|---|
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 9-221459 A | 8/1997 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004/059606 | 7/2004 |
| WO | WO 2004/097954 | 11/2004 |
| WO | WO 2005/008801 | 1/2005 |
| WO | WO 2005/089288 | 9/2005 |

(56) References Cited

FOREIGN PATENT DOCUMENTS

OTHER PUBLICATIONS

Adachi, C. et al., "High-efficiency organic electrophorescent devices with tris (2-phenylpyridine) iridium doped into electron-transporting materials," App. Phys. Lett. vol. 77, No. 6, Aug. 7, 2000.

Adachi, C. et al., "Nearly 100% internal phosphorescence efficiency in an organic light emitting device," Journal of Applied Physics (2001), vol. 90:10, pp. 5048-5051.

Adachi, et al. "Electroluminescence in Organic Films with Three-Layer Structure," Japanese Journal of Applied Physics, 27, L269 (1988).

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Ammermann, D. et al., "Photonic devices based on crystalline organic semiconductors for optoelectronic integrated circuits," Jps. J. Appl. Phys. Pt. 1 (1995) vol. 34, pp. 1293-1297.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Baldo, et al. "Highly efficient phosphorescent emission from organic electroluminescent devices," Nature, vol. 395, Sep. 10, 1998, pp. 151-154.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Baldo, M., et al., "Organic vapor phase deposition," Advanced Materials, 1998, 10, No. 18, pp. 1505-1514.

Bandyopadhyay, A, et al. "Large conductance switching and memory effects in organic molecules for data-storage applications," Appl. Phys. Lett. 82, 1215 (2003).

Bard, A. J., Faulkner, R.J., Electrochemical Methods: Fundamentals and Applications, Wiley, 2nd Ed., 2000 (Chapter 2).

Bard, A. J., Faulkner, R.J., Electrochemical Methods: Fundamentals and Applications, Wiley, 2nd Ed., 2000 (Chapter 6).

Bastard, G., "Wave mechanics applied to semiconductor heterostructures," The Editions of Physique, (1988) pp. 64-67.

Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.

Baumgartel, H. et al., "Polarographische Untersuchungen zur Konformation von 1.2.3.4.5-pentaarylimidazoliumkationen," Ber. Bunsenges (1972) 76/2, 94-100.

Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel IDW'04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=dl&dok_ext=pdf&filename=963580051.pdf.

Blochwitz, J. et al., "Interface electronic structure of organic semiconductors with controlled doping levels," Org. Electronics 2, 97 (2001).

Blochwitz, J., et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.

Bloom, C. J. et al., "Low work function reduced metal complexes as cathodes in organic electroluminescent devices," J. of Phyiscal Chemistry B, vol. 107, No. 13, pp. 2933-2938.

Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.

Colle, M. et al. "Switching and filamentary conduction in non-volatile organic memories," Organic Electronics, 7, 305-312 (Oct. 2006).

Connelly, N. G. et al., "Chemical Redox Agents for Organometallic Chemistry," Chem. Rev., 96, 877 (1996).

Cotton, F. et al., "Closed-shell molecules that ionize more readily than cesium," Science, vol. 298, No. 5600, pp. 1971-1974 (Dec. 6, 2002).

D'Andrade, B.W. et al., "Relationship between the ionization and oxidation potentials of molecular organic semiconductors," Organic Electronics 6, 2005, pp. 11-20.

D'Andrade, Brian W., "Operational stability of electrophosphorescent devices containing p and n doped transport layers," Applied Physics Letters, vol. 83, No. 19, Nov. 10, 2003, pp. 3858-3860.

D'Andrade, Brian W., et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Day et al. "The use of charge transfer interlayers to control hole injection in molecular organic light-emitting diodes," Thin Solid Films, 410 (2002) pp. 159-166.

Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

(56) References Cited

OTHER PUBLICATIONS

Harada, K. et al. "Ionized impurity scattering in n-doped C60 thin films," Applied Physics Letters, 91, 092118 (2007).
Harada, K. et al. "Organic Homojunction Diodes with a High Built-in Potential: Interpretation of the Current-Voltage Characteristics by a Generalized Einstein Relation," Phys. Rev. Lett. 94, 036601 (2005).
Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).
Hino, Yuichi et al., "Efficient low molecule phosphorescent organic light emitting diodes fabricated by wet-processing," Organic Electronics, Aug. 8, 2004, vol. 5, pp. 265-270.
Hong, Il-Hwa et al. "Effective hole injection of organic light-emitting diodes by introducing buckminsterfullerene on the indium tin oxide anode," Applied Physics Letters, 2005, 87, 063502-1.
Hu, Wenping et al., "Efficient red electroluminescence from devices having multilayers of a europium complex," Appl. Phys. Lett. vol. 77, No. 26, Dec. 25, 2000.
Huang, Jingsong et al., "Effect of well number on organic multiple-quantum-well electroluminescent device characteristics," Applied Physics Letters, (1998), vol. 73:23, pp. 3348-3350.
Huang, Jingsong et al., "Influence of the thickness and doping of the emission layer on the performance of organic light-emitting diodes with PiN structures," Journal of Applied Physics, (2003), vol. 93:2, pp. 838-844.
Huang, Jingsong et al., "Low operating voltage and high-efficiency organic multilayer electroluminescent devices with p-type doped hole injection layer," Jps. J. Appl. Phys., (2001), vol. 40, pp. 6630-6633.
Huang, Jingsong et al., "Low-voltage organic electroluminescent devices using pin structures," Applied Physics Letters, vol. 80, No. 1, Jan. 7, 2002, pp. 139-141.
Hughes, et al. "Electron transporting materials for organic electroluminescent and electrophosphorescent devices," Journal of Materials Chemistry (2005), vol. 15, pp. 94-107.
Hung, L.S. et al., "Recent progress of molecular organic electroluminescent materials and devices," Materials Science and Engineering Reports, 39, 2002, pp. 143-222.
Ikai, M. et al., "Highly Efficient Phosphorescence From Organic light-emitting devices with an exciton-block layer," Appl. Phys. Lett. vol. 79, No. 2, Jul. 9, 2001.
Ioannidis, A. et al., "Hole and electron transport in chloroaluminum phtalocyanin thin films," The Journal of Physical Chemistry B, 1997, vol. 101, pp. 5100-5107.
Ishii, M. et al., "Improvement of organic electroluminescent device performance by in situ plasma treatment of indium-tin-oxide surface," J. Lumin., 1165 (2000).
Kido, Junji; "Recent progress in organic light-emitting devices," Proceedings of the 1st International Display Manufacturing Conference IDMC 2000, Seoul Korea, Sep. 5, 2009, pp. 399-400.
Koch, N. et al., "Optimized hole Injection with Strong Acceptors at Organized-Metal Interfaces," Phys. Rev. Lett., vol. 95, pp. 237601-237603, Nov. 30, 2005.
Krieger et al. "Molecular analogue memory cell based on electrical switching and memory in molecular thin films," Synthetic Metals, 122, 199-202 (May 2001).
Kwong, R.C. et al. "Current Status of Electrophosphorescent Device Stability," Org. Electr., vol. 4 (2003): pp. 155-164.
Kwong, Raymond C., et al., "High operational stability of electrophosphorescent devices," Applied Physics Letters, Jul. 1, 2002, vol. 81, No. 1, pp. 162-164.
Lambert, M.A., "Volume-controlled current injection in insulators," Rep. Progr. Phys. 27, 329 (1964).
Lee et al. "The Effect of C60 doping on the device performance of organic light-emitting diodes," Applied Physics Letters, 86 (2005) 063514 (3 pages).
Lee, et al. "Effects of hydroxyl groups in polymeric dielectrics on organic transistor performance," Applied Physics Letters, 88, 162109 (2006).
Liping, Ma et al. "Nonvolatile electrical bistability of organic/metal-nanocluster/organic system," Appl. Phys. Lett. 82, 1419-1421 (Mar. 3, 2003).
Lu, Ping et al., "Synthesis of octasubstituted cyclooctatetrainees and their use as electron transporters in organic light emitting diodes," Journal of the American Chemical Society, 2000, vol. 1222, pp. 7480-7486.
Lupton, J. M. et al., "Bragg scattering from periodically microstructured light emitting diodes," Appl. Phys. Lett., vol. 77, pp. 3340-3342, Nov. 2000.
Ma, E.Y., et al. "Thin Film Transistors for Foldable Displays," IEEE Technical Digest, Electron Devices Meeting, 1997. IEDM '97. (Dec. 7-10, 1997): pp. 535-538.
Madigan, C.F. "Improvement of Output coupling efficiency of organic light emitting diodes by backside substrate modification," Appl. Phys. Lett., vol. 76, pp. 1650-1652, Mar. 2000.
Maennig, B. et al. "Controlled p-type doping of polycrystalline and amorphous organic layers: Self-consistent description of conductivity and field-effect mobility by a microscopic percolation model," Physical Review B, 64, 195208 (2001).
Matsumura, M. et al., "Analysis of current-voltage characteristics of organic light emitting diodes having a LiF/Al cathode and an A1-hydroxyquinoline/diamine junction," Applied Physics Letters, 2872 (1998).
Mattoussi, H. et al., "Photoluminescence quantum yield of pure and molecularly doped organic solid films," Journal of Applied Physics, (1999), vol. 86:5, p. 2642.
Miller, L.L. et al., "A simple comprehensive correlation of organic oxidation and ionization potentials," J. Org. Chem., 1972, vol. 37, No. 6, pp. 916-918.
Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.
Murata, Hideyuki et al., "Efficient organic light-emitting diodes with undoped active layers based on silole derivatives," Applied Physics Letters, Jan. 14, 2002, vol. 80, No. 2, pp. 189-191.
Naito, Katsuyuki et al.; "Molecular design, synthesis, and physical properties of nonpolymeric amorphous dyes for electron transport," The Journal of Physical Chemistry A, 1997, vol. 101, pp. 2350-2357.
Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.
Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.
Pacios, R., et al., "Charge separation in polyfluorene composites with internal donor/acceptor heterojunctions," Synthetic Metals, 2002, vol. 127, pp. 261-265.
Parker, "On the Problem of Assigning Values to Energy Changes of Electrode Reactions," Journal of the American Chemical Society, 96:17, Aug. 21, 1974, pp. 5656-5661.
Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.
Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.
Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.
Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.
Pope, et al., "Single positive or negative carriers in organic crystals," Electronic Processes in Organic Crystals and Polymers, Oxford Science Publications, Oxford University Press, (1999), pp. 202-207.

(56) References Cited

OTHER PUBLICATIONS

Potember, R.S. et al. "Electrical switching and memory phenomena in Cu-TCNQ thin films," Appl. Phys. Lett. 34, 405 (1979).
Pudzich, R., et al., "Synthesis and characterization of new oxadizoleamine based spiro-linked fluorescence dyes," Synthetic Metals, 2003, vol. 138, pp. 21-31.
R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.
Redecker, M., et al., "Electron transport in starburst phenylquinoxalines," Applied Physics Letters, Jul. 5, 1999, vol. 75, No. 1, pp. 109-111.
Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.
Sato, N., et al., "Polarization Energies of Organic Solids Determined by Ultraviolet Photoelectron Spectroscopy," J. Chem. Soc. Faraday Trans. 2, 77, 1621 (1981).
Schnitzer, J., "30% External Quantum Efficiency from Surface Textured, Thin-film Light emitting diodes," Applied Phys. Lett., vol. 63, pp. 2174-2176, Oct. 1993.
Shinar, J. "Organic Light-Emitting Devices—A Survey" (Adachi et al. "Design concept of molecular materials for high-performance OLED" p. 43)) AIP-Press, Springer, New York 2004.
Shirota, Yasuhiko et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.
Shirota, Yasuhiko; "Organic materials for electronic and optoelectronic devices," Journal of Materials Chemistry, 2000, vol. 10, pp. 1-25.
Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.
Tang, C. W., et al., "Electroluminescence of doped organic thin films," Journal of Applied Physics, (1989), vol. 65:9, pp. 3610-3616.
Tang, C.W. et al., "Organic electroluminescent diodes," Applied Physics Letters, vol. 51, No. 12, Sep. 21, 1987, pp. 913-915.
Tang, T.B. et al., "Ionization thresholds of merocyanine dyes in the solid state," Journal of Applied Physics, vol. 59, (1), Jan. 1986, pp. 5-10.
Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.
Tokito, Shuzuo et al., "Improvement of emission efficiency in polymer light-emitting devices based on phosphorescent polymers," Thin Solid Films, Dec. 15, 2003, vol. 445, No. 2, pp. 353-357.
Tsiper, E.V. and Soos, Z.G.; "Charge redistribution and polarization energy of organic molecular crystals," Physical Review B; vol. 64; 195124-1.
Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.
Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.
Vissenberg, M.C. et al. "Theory of the field-effect mobility in amorphous organic transistors," Physical Review B, 27, 12964 (1998).
Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.
Werner, A. G. et al., "Pyronin B as a donor for n-type doping of organic thin films," Applied Physics Letters, vol. 82, No. 25, Jun. 23, 2003, pp. 4495-4497.
Werner, A.G. et al., "n-Type Doping of Organic Thin Films Using Cationic Dyes," Adv. Funct. Mater., vol. 14, No. 3 (Mar. 2004): pp. 255-260.
Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.
Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.
Yamasaki, T. et al., "Organic Light emitting device with an ordered monolayer of silica microspheres as a scattering medium," Appl. Phys. Lett., vol. 76, pp. 1243-1245, Mar. 2000.
Yang, et al., 2003, "Self-assembly and Magnetic Properties of Cobalt Nanoparticles," Appl. Phys. Lett., 82(26): 4729.
Yang, Y. et al. "Organic electrical bistable devices and rewritable memory cells," Appl. Phys. Lett. 80, 2997 (2002).
Yao, Fu et al., "Quantum-chemical predictions of Absolute standard redox potentials of diverse organic molecules and free radicals in acetonitrile," J. Am. Chem. Soc. 2005, 127, pp. 7227-7234.
Yuan et al. "Fullerene-doped hole transport molecular films for organic light-emitting diodes," Applied Physics Letters, 86 (2005) 143509 (3 pages).
Zhi-Ming, Zhang; "Organic light emitting diodes based on new oxadiazole and pyrazoline derivatives," China Physics Letters, 2000, vol. 17, No. 6, pp. 454-456.
Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.
Zhou, X. et al., "Low-voltage inverted transparent vacuum deposited organic light-emitting diodes using electrical doping," Applied Physics Letters, vol. 81, No. 2, Jul. 29, 2002, pp. 922-924.
Zhou, X., et al. "High-efficiency electrophosphorescent organic light-emitting diodes with double light-emitting layers," Applied Physics Letters, Nov. 18, 2002, vol. 81, No. 21, pp. 4070-4072.
Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2007.

(56) References Cited

OTHER PUBLICATIONS

International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 12/297,506 Submitted Herewith.
Japanese Office Action for JP Application No. 2009-505758 mailed Jun. 12, 2012 (8 pages) (English translation).
English Translation of the Examination Notification mailed Jul. 19, 2013 for Taiwan Patent Application No. 096113720 (8 pages).

* cited by examiner

LIGHT-EMITTING COMPONENT

CROSS-REFERENCE TO RELATED APPLICATION

This is a submission pursuant to 35 U.S.C. 154(d)(4) to enter the national stage under 35 U.S.C. 371 for PCT/EP2007/003311 filed Apr. 13, 2007. Priority is claimed under 35 U.S.C. 119(a) and 35 U.S.C. 365(b) to European Patent Application No. 06008082.7 filed Apr. 19, 2006 and European Patent Application No. 06009302.8 filed May 5, 2006. The subject matters of PCT/EP2007/003311 and European Patent Applications No. 006008082.7 and European Patent Application 06009302.8 are hereby expressly incorporated herein by reference.

The invention relates to a light-emitting device, in particular a light-emitting diode, with an arrangement of layers on a substrate wherein the arrangement of layers comprises an anode contact and a cathode contact as well as a light-emitting layer stack, arranged between the anode contact and the cathode contact, having a polymer layer consisting of a polymer material and a low-molecular layer with small molecules of an organic material deposited in a vacuum.

BACKGROUND OF THE INVENTION

Since the demonstration of low working voltages [compare Tang et al.: Appl. Phys. Lett. 51 (12), 913 (1987)], organic light-emitting diodes have become promising candidates for the realisation of large-surface displays and other applications such as illuminating elements. They comprise an arrangement of thin layers of organic materials. Either, the layers are preferably vapour-deposited in a vacuum in the form of molecules. Low-molecular layers are formed in this way. An organic light-emitting diode on the basis of low-molecular layers formed in this way from separable molecules by means of vacuum evaporation is designated as an OLED in its abbreviated form. Reference is also made to the "small molecule" technology field in this connection.

Alternatively, the layers consisting of materials are formed from polymer materials which are spin-coated from a solution, printed or applied in any other suitable form, so that polymer (organic) layers are established. An organic light-emitting diode on the basis of polymer layers formed in this way is also designated as PLED in the abbreviated form.

With the injection of charge carriers, namely of electrons and holes, from the electrode contacts into the organic layers arranged in between when placing an external voltage to the electrode contacts, of the following formation of exitones (electron-hole couples) in an active light-emitting zone (emission zone) within the organic layers and the radiating recombination of the exitones, light is generated and emitted from the device.

Organic light-emitting diodes with a PLED-configuration are normally based on the following layer structure: (1) carrier substrate (transparent, made from glass for example); (2) anode contact (transparent, usually made from indium tin oxide (ITO)): (3) hole transport or hole injection layer (for example from PEDOT:PSS or PANI—polyaniline with admixtures such as PSS; PEDOT=polyethylene dioxythiophene, PSS=polystyrene sulfonate); (4) polymer layer as a light-emitting zone from a polymer material (for example MEH-PPV, polyfluorenes, other PPVs, polyspiros, polythiophenes or polyparaphenylenes) and (5) cathode contact (for example from a metal with low work function such as barium, calcium).

The polymer layers, namely the hole transport or hole injection layer and the light-emitting zone are manufactured from a liquid solution, for example in water or in solvents. The electrode contacts (anode and cathode contact) are produced typically by means of vacuum processes.

The advantages of this structure of an organic light-emitting diode for applications, displays for example, are the diversity of the processes for forming the polymer layers. Included here are such processes which allow a plain lateral structuring of the PLED, namely the inkjet printing technique. With this method different types of polymer materials are printed onto previously treated locations, through which adjacent areas of different emission colour can originate. Other structuring methods include the screen printing technique.

The disadvantage of the known PLED structures is, among other things, the fact that not more than two different polymer layers can be deposited in a suitable manner because the solvents of the polymer materials must be selected in such a way that they do not influence each other, meaning, that they do not attack the material of the substructure. This means that the deposited polymer material must be simultaneously good for the electron transport and must be suitable for the electron injection from the cathode contact, a requirement which is a major restriction for the material selection and the structure optimisation. Recent examinations have shown that three-layer structures are also realisable.

In addition, the sequence of the structure for a given material system can be changed with a great amount of difficulty only. As described above, therefore, the anode contact is the starting point.

This is particularly disadvantageous for the integration of the PLED structure on active matrix display substrates with n-channel transistors as a contact element. The use of transparent top contacts is also difficult because these (i) have an unfavourable work function for the electron injection (work function is too great) and (ii) are usually manufactured by means of a sputtering process. However, this process destroys organic materials. As the upper layer in a PLED is a light-emitting layer, the efficiency of the light generation of the organic light-emitting diode is reduced as a result. In order to improve the stability against sputtering damage the application of a low-molecular organic layer, vapour-deposited in a vacuum, consisting of small molecules was envisaged. In this ease also, however, the electron injection from the cathode contact is a problem.

A further disadvantage of the conventional PLED structure is the fact that an efficient electron injection can be obtained with only very unstable contact materials such as barium or calcium. These materials, however, are attacked by oxygen and water. Moreover, it is very difficult to use one and the same electrode (cathode) for all emitter materials of the three basic emission colours red, green and blue because this involves considerable performance losses with one of the three colours. An optimised cathode contact for the blue-emitting polymer material has disadvantages for the red-emitting polymer material, and vice versa.

Organic light-emitting diodes with an OLED-configuration which are allocated to the field of the "small molecule" technology have, as organic structures, layers from molecules that are vapour-deposited in a vacuum where said molecules are of one or several organic materials. If the molecules of the organic material are small enough, they can usually be deposited without decomposition by means of a thermal process. For this purpose, the molecules are evaporated in a vacuum.

A typical structure of an organic light-emitting diode with OLED configuration (maximum configuration) is as follows:

(1) carrier substrate (glass, for example); (2) anode contact (hole-injecting, preferably transparent, made from indium tin oxide (ITO), for example); (3) hole-injecting layer (for example from CuPc (copper-phthalocyanine) or starburst derivatives); (4) hole transport layer (for example from TPD (triphenyldiamine and derivatives); (5) hole-side blocking layer (in order to prevent exitone diffusion from the light-emitting area and to prevent charge carrier leakage from the light-emitting area, for example from Alpha-NPB); (6) light-emitting area (for example CBP with emitter admixture (for example iridium-tris-phenylpyridine Ir(ppy)$_3$)); (7) electron-side blocking layer (in order to prevent exitone diffusion from the light-emitting area and to prevent charge carrier leakage from the emission area, for example from BCP (bathocuproine)); (8) electron transport layer (for example from Alq$_3$ (aluminium-tris-quinolate)); (9) electron injection layer (for example from inorganic lithium fluoride (Lin); and (10) cathode contact (electron injecting, usually made from a metal with low work function, aluminium for example). The design as described comprises a maximum number of possible layers. In other designs, layers can be dispensed with. One layer can also take over several functions. For example, the hole injection layer and the hole transport layer or the hole transport layer and the hole-side blocking layer or the hole injection layer, the hole transport layer and the hole-side blocking layer can be put together. There is furthermore the option of mixing the materials of the electron injection layer into the electron transport layer.

With the OLED configuration there is also the option of envisaging doped transport layers with electric doping for improving the electric conductivity. Their general and typical structure is as follows: (1) carrier substrate (glass, for example); (2) anode contact (hole-injecting, preferably transparent, made from ITO for example, but also from Ag, Au and as another reflecting contact); (3) p-doped holes injecting and transporting layer (the dopant is then an acceptor material which is capable of taking over electrons from a matrix material, for example from m-MTDATA doped with F4-TCNQ, for further acceptor dopants refer to U.S. Pat. No. 6,908,783 B1); (4) hole-side blocking layer (from a material whose tape layers match the tape layers of the layers surrounding it, so that exciplex formation between holes on the p-doped hole injecting and transporting layer and electrons in a light-emitting area is prevented; alpha-NPB, for example); (5) light-emitting area (for example from TCTA with emitter admixture, for example iridium-tris-phenylpyridine Ir(ppy)$_3$)); (6) electron-side block layer (typically thinner than the following named layer; from a material whose tape layers match the tape layers of the layers surrounding it, so that exciplex formation between holes on the p-doped holes injecting and transport layer and electrons in a light-emitting is prevented; for example from BCP); (7) n-doped electron injecting and transporting layer (the dopant is then a donor which is capable of transmitting additional electrons onto a matrix material; for example from BPhen—bathophenanthroline doped with caesium as inorganic dopants or $W_2(Xpp)_4$ (tetrakis(1,2,3,3a,4,5,6,6a,7,8-decahydro-1,9,9b-triazaphenalenyl)ditungsten (II); for further dopants refer to US 2005/0040390 A1, US 2005/0061232 A1, WO 2005/036667 A 1, WO 2005/086251 A3); and (8) cathode contact (electron injecting, usually made from a metal with low work function, for example Al, but also from Ag, Au).

At the beginning of the evaporating process, the dopants in the doped layers do not have to be in their final form as long as an alternatively applied precursor material forms the dopant during the evaporating process, which can also be modified, for example with the use of electron beams. The manufacture of the mixed layers is typically effected by means of mixed (co-) evaporation.

The advantages of such an OLED configuration are its higher light generation efficiency as well as the life service and the variance of the structure. The longer life service of the devices with OLED-configuration compared to the devices with PLED-configuration is explainable by the higher degree of purity of the applied organic materials as obtained with vacuum cleaning methods. Advantages are furthermore the separated optimising capability of the properties of the individual layers, the adjustably large clearance of the light-emitting area to the electrode contacts. With doped devices of the pin-OLED-type, there are also a low operating voltage and a variance of the electrode materials. As presented, for example, in the document US 2004/0251816 A1 and in Zhou et al. (Appl. Phys. Lett. 81, 922 (2002)), this structure can also, and in addition, be easily inverted and can be made top-emitting or fully transparent (compare US 2006/0033115 A1).

The disadvantage of such devices is that a lateral structuring of the OLED-structure for the configuration of differently coloured pixels in a display is normally performed with shadow masks. This process has limitations with regard to the smallest obtainable pixel sizes which are less than approximately 50 μm. Shadow masking in a manufacturing process involves a relatively considerable work effort. The inkjet process as used for depositing polymer materials is either not useable or only useable with limitations for small molecules during the formation of low molecular layers due to the non-solubility of the organic materials of the small molecules. LITI ("Laser Induced Thermal Imaging") is an alternative process which, on its part, has limitations particularly with the selection of the process-compatible materials.

Furthermore, organic light-emitting devices with a hybrid structure are known which are also designated as hybrid organic devices for this reason. In the document US 2003/020073 A1 the use of vapour-deposited low-molecular blocking layers and electron transport layers on a polymer hole transport layer is described. However, with this arrangement the injection of charge carriers, namely electrons from the cathode contact into the low-molecular electron transport layer, is problematic. The operating voltage of the device is increased as a result.

The document WO 2005/086251 focuses on the use of a metal complex as an n-dopant for an organic semi-conducting matrix material, an organic semiconductor material and an electronic device as well as a dopant and a ligand.

In the document EP 1 511 094 A2, a light-emitting device is disclosed wherein organic molecule layers and polymer layers are envisaged.

The properties of the different materials involved can be described in the PLED-configuration and in the OLED-configuration by the energy levels of the lowest unoccupied molecular orbital (LUMO) and the highest occupied molecular orbital (HOMO). Hole transport layers, including related blocking materials, usually have HOMOs in the range of 4.5 eV to 5.5 eV under vacuum level, LUMOs in the range of 1.5 eV to 3 eV. With materials for the light-emitting range, the HOMOs lie in the range of 5 eV to 6.5 eV and the LUMOs in the range of 2 to 3 eV. With materials for electron transport layers, including suitable blocking materials, the HOMO lies in the range of 5.5 eV to 6.8 eV and the LUMO in the range of 2.3 eV to 3.3 eV. The work functions for the extraction of electric charge carriers with the materials for the anode contact lie in the range of 4 eV to 5 eV and for the cathode contact in the range of 3 eV to 4.5 eV.

SUMMARY OF THE INVENTION

The task of the invention is to provide for a light-emitting device with increased flexibility with regard to the structure and improved injection of charge carriers from the electric contacts in the light-emitting layer stacks. In addition, a good structuring capability of the light-emitting device is to be maintained in this case.

This task is solved, at least in part, by a light-emitting device, in particular a light-emitting diode, with an arrangement of layers on a substrate, wherein the arrangement of layers has an anode contact and a cathode contact which are in electrical contact with a light-emitting layer stack arranged between the anode contact and the cathode contact which, on its part, comprises a polymer layer from a polymer material and a low-molecular layer of vacuum-deposited small molecules of an organic material that is depositable by means of vacuum evaporation, and wherein the small molecules of the low-molecular layer are formed as:

donor molecules with an oxidation potential versus Fc/Fc+ (ferrocene/ferrocenium redox couple) of maximum approx. −1.5 V, if the low-molecular layer is arranged adjacent to the cathode contact, or acceptor molecules with a reduction potential versus Fc/Fc+ (ferrocene/ferrocenium redox couple) of minimum aprrox. −0.3 V, if the low-molecular layer is arranged adjacent to the anode contact.

A light-emitting device, particularly a light-emitting diode, is envisaged according to the invention with an arrangement of layers on a substrate, wherein the arrangement of layers has an anode contact and a cathode contact which are in electrical contact with a light-emitting layer stack arranged between the anode contact and the cathode contact which, on its part, comprises a polymer layer from a polymer material and a low-molecular layer of vacuum-deposited small molecules of an organic material that is separable by means of vacuum evaporation, and wherein the small molecules of the low-molecular layer are formed as:

donor molecules with an oxidation potential versus Fc/Fc$^+$ (ferrocene/ferrocenium redox couple) of maximum approx. −1.5 V, if the low-molecular layer is arranged adjacent to the cathode contact, and acceptor molecules with a reduction potential versus Fc/Fc$^+$ (ferrocene/ferrocenium redox couple) of minimum approx. −0.3 V, if the low-molecular layer is arranged adjacent to the anode contact.

By means of the combination of the polymer layer from the polymer material and the low-molecular layer with the vacuum-deposited small molecules of an organic material in the light-emitting device a higher flexibility for the light-emitting layer stack is obtained, wherein with the formation of the polymer layer an easier structuring capability of the device for producing pixel areas, which emit light in various colours, is obtained without the necessity of having to use shadow masks as normally used for light-emitting organic devices which are formed on the basis of small molecules of organic materials.

There is the advantage furthermore that the material for the electrode contacts is freely selectable. Possible losses during the injection of charge carriers are minimised or even avoided totally. Stable light-emitting devices with a long life service have been created. The otherwise conventional co-evaporation of organic materials is not necessary.

With a further development of the invention, it is envisaged that the layer stack comprises a further low-molecular layer from vacuum-deposited small molecules of a further organic material that is separable by means of vacuum evaporation which is selectively different from the organic material, wherein the small molecules of the further low-molecular layer are formed as:

the acceptor molecules with the oxidation potential versus Fc/Fc$^+$ (ferrocene/ferrocenium redox couple) of maximum approx. −1.5 V, if the further low-molecular layer is arranged adjacent to the anode contact and the low-molecular layer is arranged adjacent to the cathode contact, and the donor molecules with the reduction potential versus Fc/Fc$^+$ (ferrocene/ferrocenium redox couple) of minimum approx. −0.3 V, if the further low-molecular layer is arranged adjacent to the cathode contact and the low-molecular layer is arranged adjacent to the anode contact.

A purposeful embodiment of the invention can envisage that the donor molecules have an oxidation potential versus Fc/Fc$^+$ (ferrocene/ferrocenium redox couple) of maximum approx. −2.0 V, preferably of maximum approx. −2.2 V.

A preferred further development of the invention envisages that the acceptor molecules have a reduction potential versus Fc/Fc$^+$ (ferrocene/ferrocenium redox couple) of minimum approx. 0 V, preferably of minimum approx. 0.24 V.

In an advantageous embodiment of the invention it is envisaged that the donor molecules and/or the acceptor molecules have a molar mass between approx. 100 g/mol and approx. 200 g/mol, preferably between approx. 200 g/mol and approx. 1000 g/mol.

In a purposeful embodiment of the invention it is envisaged that the donor molecules are formed at least partially as $W_2(Xpp)_4$ molecules.

In a further development of the invention it is envisaged that the acceptor molecules are formed at least partially as $C_{14}DCNQI$ molecules.

A purposeful embodiment of the invention can envisage that the low-molecular and/or the further low-molecular layer have a layer thickness between approx. 0.5 nm and approx. 20 nm, preferably between approx. 1 nm and approx. 10 nm and more preferably between approx. 1 nm and approx. 5 nm.

A preferred further development of the invention envisages that the polymer layer is a light-emitting and charge carrier transporting layer.

In an advantageous embodiment of the invention it is envisaged that the polymer layer has a layer thickness of between approx. 20 nm and approx. 500 nm, preferably between approx. 40 nm and approx. 150 nm and more preferably between approx. 50 nm and approx. 100 nm.

In a purposeful embodiment of the invention it is envisaged that the polymer layer is selected from a polymer material from the following group of polymer materials: polyfluorene, PPVs, polyspiros, polythiophene and polyparaphenylene.

In a further development of the invention it is envisaged that, between the anode contact and the polymer layer, a polymer hole injection layer is arranged if the low-molecular layer is arranged adjacent to the cathode contact.

A purposeful embodiment of the invention can envisage that the polymer hole injection layer has a layer thickness between approx. 20 nm and approx. 500 nm, preferably between approx. 40 nm and approx. 150 nm and more preferably between approx. 50 nm and approx. 100 nm.

A preferred further development of the invention envisages that, between the low-molecular layer and the polymer layer, a low-molecular organic electron transport layer is arranged if the low-molecular layer is arranged adjacent to the cathode contact.

In an advantageous embodiment of the invention it is envisaged that the low-molecular organic electron transport layer comprises an organic matrix material which is electrically doped with a low-molecular organic donor material.

In a purposeful embodiment of the invention it is envisaged that the low-molecular organic electron transport layer has a doping concentration (donor material molecules:matrix material molecules) between 1:1000 and 1:2, preferably between 1:100 and 1:5 and more preferably between 1:100 and 1:10.

In a further development of the invention it is envisaged that the organic donor material has a molar mass between approx. 100 g/mol and approx. 2000 g/mol, and preferably between approx. 200 g/mol and approx. 1000 g/mol.

A purposeful embodiment of the invention can envisage that the low-molecular organic electron transport layer has a layer thickness between approx. 10 nm and approx. 500 nm, preferably between approx. 20 nm and approx. 200 nm, and more preferably between approx. 20 nm and approx. 100 nm.

A preferred further development envisages that the low-molecular organic donor material is $W_2(Xpp)_4$.

In an advantageous embodiment of the invention it is envisaged that, between the low-molecular layer and the polymer layer, a low-molecular organic blocking layer is arranged if the low-molecular layer is arranged adjacent to the cathode contact.

In a purposeful embodiment of the invention it is envisaged that the low-molecular organic block layer has a layer thickness between approx. 2 nm and approx. 50 nm, preferably between approx. 2 nm and approx. 30 nm, and more preferably between approx. 5 nm and approx. 20 nm.

In a further development of the invention it is envisaged that, between the cathode contact and the polymer layer, a polymer electron injection layer is arranged if the low-molecular layer is arranged adjacent to the anode contact.

A purposeful embodiment of the invention can envisage that the polymer electron injection layer has a layer thickness between approx. 20 nm and approx. 500 nm, preferably between approx. 40 nm and approx. 150 nm, and more preferably between approx. 50 nm and approx. 100 nm.

A preferred further development of the invention envisages that, between the low-molecular layer and the polymer layer, a low-molecular organic hole transport layer is arranged if the low-molecular layer is arranged adjacent to the anode contact.

In an advantageous embodiment of the invention it is envisaged that the low-molecular organic hole transport layer comprises an organic matrix material which is electrically doped with a low-molecular organic acceptor material.

In a purposeful embodiment of the invention it is envisaged that the low-molecular organic hole transport layer has a doping concentration (acceptor material molecules:matrix material molecules) between 1:1000 and 1:2, preferably between 1:100 and 1:5 and more preferably between 1:100 and 1:10.

In a further development of the invention it is envisaged that the organic acceptor material has a molar mass between approx. 100 g/mol and approx. 2000 g/mol, and preferably between approx. 200 g/mol and approx. 1000 g/mol.

A purposeful embodiment of the invention can envisage that the low-molecular organic hole transport layer has a layer thickness between approx. 10 nm and approx. 500 nm, preferably between approx. 20 nm and approx. 200 nm, and more preferably between approx. 20 nm and approx. 100 nm.

A preferred further development envisages that the low-molecular organic acceptor material is $C_{14}DCNQI$.

In an advantageous embodiment of the invention it is envisaged that, between the low-molecular layer and the polymer layer, a further low-molecular organic blocking layer is arranged if the low-molecular layer is arranged adjacent to the anode contact.

In a purposeful embodiment of the invention it is envisaged that the further low-molecular organic blocking layer has a layer thickness between approx. 2 nm and approx. 50 nm, preferably between approx. 2 nm and approx. 30 nm, and more preferably between approx. 5 nm and approx. 20 nm.

In a further development of the invention it is envisaged that the arrangement of layers is formed according to at least one configuration selected from the following group of configurations: inverted configuration; non-inverted configuration; light which is generated in the light-emitting layer stack, configuration emitting away from the substrate ("top-emission"), and light which is generated in the light-emitting layer stack, configuration emitting through the substrate ("bottom emission").

A purposeful embodiment of the invention can envisage that the arrangement of layers with the substrate is transparent.

A preferred further development of the invention envisages by means of a bottom contact and a top contact which are formed by means of the anode contact or the cathode contact and which are from one or several metals, a combination of a metal and a degenerated semiconductor material or a metal alloy.

The depositing of the polymer layers which are formed from one or several polymer materials is effected with the help of uncomplicated means with high precision. A structuring achieved in this way simultaneously serves the purpose of the structuring of the light-emitting device to be manufactured without the requirement for work-intensive structuring steps or means. It is envisaged in a preferred embodiment that the polymer layers are applied by means of the inkjet printing method.

The inclusion of the low-molecular layers from one or several organic materials serves to avoid a restriction of the modification of the polymer layers resulting from the existence of normally only two disjoint solvents for the depositing of the polymer materials, and in this way it increases the variation options of the layer structure of the device. During the manufacture of the light-emitting device, the donor and/or the acceptor molecules for the low-molecular layer(s) can be produced at first in the vacuum from a precursor by evaporating an organic basic material acting as the precursor, and this basic material forms the donor/acceptor molecules during the evaporation process.

The light-emitting devices according to the invention can be used as a device in various applications. These application options comprise in particular the use of the light-emitting devices in displays, readouts and lighting equipment of all types. In one embodiment the device is formed with pixel zones which emit light in various colours, particularly red, green and blue light. A multi-coloured device is formed in this way.

DESCRIPTION OF PREFERRED EMBODIMENTS OF THE INVENTION

Figure 2:
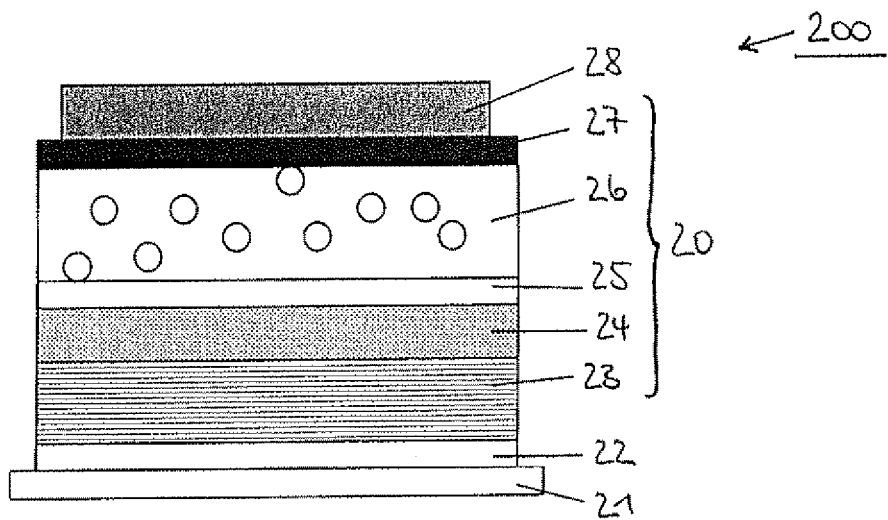

The invention is described as follows in greater detail on the basis of embodiment examples with reference to the Figures of a drawing. The Figures show the following:

FIG. 1 a schematic illustration of a light-emitting device with an arrangement of layers with a non-inverted configuration; and FIG. 2 a schematic illustration of a further light-emitting device with an arrangement of layers with an inverted configuration.

FIG. 1 shows a schematic illustration of a light-emitting device 100 with an arrangement of layers with a non-inverted configuration where an anode contact 2 is formed on a substrate 1. The light-emitting device 100 emits light which is generated in a light-emitting layer stack 10, through the substrate 1, for which reason the substrate 1 and the anode contact 2 are transparent for the generated light. The substrate 1 has a suitable layer thickness. The transparent anode contact 2 has a layer thickness between 10 nm and approx. 500 nm. In other designs, the layer thickness is between approx. 20 nm and approx. 200 nm. As a material for the anode contact 2, for example, a degenerated organic semiconductor material is used; for example indium tin oxide (ITO) or a metal which has a thin layer thickness and which is semi-transparent.

A polymer hole injection layer 3 from a polymer material is arranged on the anode contact 2 according to FIG. 1. The polymer hole injection layer has a layer thickness between approx. 20 nm and approx. 500 nm. In other designs the layer thickness is between approx. 40 nm and 150 nm, preferably between approx. 50 nm and approx. 100 nm.

A polymer layer 4 from a polymer material is arranged on the polymer hole injection layer 3 according to FIG. 1. The polymer emission layer 4 is formed hole-transporting in the embodiment according to FIG. 1, meaning, it transports electric charge carriers in the form of holes. The polymer emission layer 4 has a layer thickness of between approx. 20 nm and approx. 500 nm. In other designs the layer thickness is between approx. 40 nm and 150 nm, preferably between approx. 50 nm and approx. 100 nm. The polymer emission layer 4 is formed using at least one of the following polymer materials: polyfluorene, PPVs, polyspiros, polythiophene and polyparaphenylene.

A low-molecular electron-side blocking layer 5 from small molecules of one or several organic materials is arranged according to FIG. 1 on the polymer emission layer 4. With the help of the electron-side blocking layer 5, electric charge carriers in the form of holes are prevented from wandering out of the polymer emission layer 4. Moreover, the electron-side block layer 5 serves the purpose of blocking exitones, meaning, electron-hole-couples, from the polymer emission layer 4. Furthermore and with the help of the electron-side block layer 5, high densities of charge carriers in form of electrons in a low-molecular electron transport layer 6 and high densities of charge carriers in form of holes in the polymer emission layer 4 are separated from one another, so that the formation of exciplexes is prevented. Such an exciplex formation minimises the efficiency of the light-emitting device 100. The electron-side blocking layer 5 has a layer thickness between approx. 2 nm and approx. 50 nm. In other designs the layer thickness is between approx. 5 nm and approx. 30 nm, preferably between approx. 5 nm and approx. 20 nm.

The low-molecular electron transport layer 6 from small molecules of one or several organic materials is arranged according to FIG. 1 on the electron-side blocking layer 5. In a preferred embodiment, the low-molecular electron transport layer 6 is electrically doped with a strong low-molecular organic donor material which is doped into an organic matrix material. The low-molecular organic donor material is capable of discharging electrons to the organic matrix material. The molar mass of the organic donor material is between approx. 100 g/mol and 2000 g/mol. In another embodiment, the molar mass is between approx. 200 g/mol and approx. 1000 g/mol. The ratio of the donor molecules to the matrix material molecules, which is designated as molar doping concentration, is between 1:1000 and 1:2, in other designs between 1:100 and 1:5 or between 1:100 and 1:10. The low-molecular electron transport layer 6 is formed with a thickness of between approx. 10 nm and 500 nm. In other designs the layer thickness is between approx. 20 nm and approx. 200 nm or between approx. 20 nm and approx. 100 nm.

A low-molecular layer 7 with vacuum-deposited small organic donor molecules is arranged according to FIG. 1 on the low-molecular electron transport layer 6. The donor molecules have an oxidation potential $-1.5$ V versus Fc/Fc$^+$ (ferrocene/ferrocenium redox couple). In other embodiments, the oxidation potential is maximum approx. $-2.0$ V or maximum $-2.2$ V. This oxidation potential corresponds with a highest occupied molecular orbital (HOMO) of the donor molecules of less than approx. 3.3 eV, of less than approx. 2.8 eV and of less than 2.6 eV. The HOMO of the donor molecules can be determined from cyclo-voltammetric measurements of the oxidation potential. If the organic donor molecules are produced from a precursor in a purposeful embodiment during the layer formation of the low-molecular layer 7, then the details for the HOMO refer to the donor molecules finally produced in this way. Based on the stated properties of the donor molecules there is a formation of an ionisation of the donor molecules (positive charged) due to a reaction with a cathode contact 8 (compare FIG. 1) and/or the organic molecules of the adjacent low-molecular electron transport layer 6. A space charging formed in this way supports the injection of charge carriers from the cathode contact 8 into the low-molecular electron transport layer 6.

The cathode contact 8 is arranged according to FIG. 1 on the low-molecular layer 7 with the donor molecules. The cathode contact 8 has a layer thickness of at least 10 nm. As material for the cathode contact 8, metals are adopted such as for example Al, Ag, Au, Ca and Ba, metal alloys, a combination of metal and a degenerated semiconductor such as ITO, for example.

In alternative embodiments (not shown) of the light-emitting device 100, one or several of the layers in the light-emitting layer stack 10 can be dispensed with. These can be, for example, the polymer hole injection layer 3, the low-molecular electron-side blocking layer 5 and/or the low-molecular electron transport layer 6. The light-emitting device 100 can alternatively be executed also as that particular light which is generated in the light-emitting layer stack 10, emitting away from the substrate 1. In this case the anode contact 2 is reflecting for the generated light, and the cathode contact 8 is transparent. In a further embodiment both the anode contact 2 as well as the cathode contact 8 are transparent so that a (semi-)transparent light-emitting device is formed.

In a further embodiment (not shown) of the light-emitting device 100, a low-molecular organic layer from acceptor molecules of one or several organic materials is formed adjacent to the anode contact 2 which serves as an injection layer for electric charge carriers in the form of holes from the anode contact 2 into the light-emitting layer stack 10. The light-emitting layer with the acceptor molecules has preferably the same properties as explained in greater detail below in conjunction with the embodiment according to FIG. 2.

As follows, examples for the preceding embodiment of the light-emitting device as explained with reference to FIG. 1 are described in greater detail.

EXAMPLE 1

According to an example 1 the light-emitting device has the following structure, which comprises a low-molecular organic injection layer from donor molecules of an organic material:
1.1 transparent substrate (glass)
1.2 anode contact (indium tin oxide ITO; 90 nm thick)
1.3 polymer hole injection layer, (PEDOT:PSS (Baytron-P of H.C. Starck, Germany); 80 nm thick (spin-coated from watery dispersion)
1.4 polymer hole transporting emission layer (MEH-PPV; 70 nm thick (spin-coated from toluene solution)
1.7 low-molecular donor molecule layer ($W_2(Xpp)_4$; 2 nm thick)
1.8 cathode contact (reflecting; Al)

EXAMPLE 2

According to an example 2 the light-emitting device has the following structure, which comprises a low-molecular organic injection layer from donor molecules of an organic material:
2.1 transparent substrate (glass)
2.2 anode contact (indium tin oxide ITO; 90 nm thick)
2.3 polymer hole injection layer, (PEDOT:PSS (Baytron-P of H.C. Starck, Germany); 80 nm thick (spin-coated from watery dispersion)
2.4 polymer hole transporting emission layer (MEH-PPV; 60 nm thick (spin-coated from toluene solution)
2.6 n-doped low-molecular electron transport layer (from Alq3 doped with $W_2(Xpp)_4$, mass doping concentration 20% (corresponds to a molar doping concentration of approx. 10%); 20 nm thick)
2.7 low-molecular donor molecule layer ($W_2(Xpp)_4$; 2 nm thick)
2.8 cathode contact (reflecting; Al)

By means of the insertion of the n-doped electron transport layer 2.6, the optic cavity of the hybrid device can be adapted without incurring losses with regard to electro-optic characteristic data operating voltage and light generation efficiency. The n-doped electron transport layer 2.6 is manufactured in a vacuum by means of mixed evaporation from two independently controlled evaporation sources (for matrix material and donor molecules). The donors in the layers 2.6 and 2.7 can also be molecules of different organic materials.

EXAMPLE 3

According to an example 3 the light-emitting device has the following structure, which comprises a low-molecular organic injection layer from donor molecules of an organic material:
3.1 transparent substrate (glass)
3.2 anode contact (indium tin oxide ITO; 90 nm thick)
3.3 polymer hole injection layer, (PEDOT:PSS (Baytron-P of H.C. Starck, Germany); 80 nm thick (spin-coated from watery dispersion)
3.4 polymer hole transporting emission layer (MEH-PPV; 60 nm thick (spin-coated from toluene solution)
3.6 low-molecular electron transport layer (from $Alq_3$; 20 nm thick)
3.7 low-molecular donor molecule layer ($W_2(Xpp)_4$; 2 nm thick)
3.8 cathode contact (reflecting; Al)

In contrast to example 2, this device has a non-doped low-molecular electron transport layer. Compared with example 2, there were slight losses with regard to the measured operating voltage as a result. However, a mixed evaporation process can be dispensed with.

EXAMPLE 4

In an example 4 the light-emitting device has the following structure, which comprises a low-molecular organic injection layer from donor molecules of an organic material:
4.1 transparent substrate (glass)
4.2 anode contact (indium tin oxide ITO; 90 nm thick)
4.3 polymer hole injection layer, (PEDOT:PSS (Baytron-P of H.C. Starck, Germany); 80 nm thick (spin-coated from watery dispersion)
4.4 polymer hole transporting emission layer (MEH-PPV; 60 nm thick (spin-coated from toluene solution)
4.5 electron-side blocking layer (BPhen (bathophenanthrolin); 5 nm thick)
4.6 n-doped low-molecular electron transport layer (from $Alq_3$ doped with $W_2(Xpp)_4$, mass doping concentration 20% (corresponds to a molar doping concentration of approx. 10%); 15 nm thick)
4.7 low-molecular donor molecule layer ($W_2(Xpp)_4$; 2 nm thick)
4.8 cathode contact (reflecting; Al)

By means of the insertion of an n-doped electron transport layer 4.6, the optic cavity of the light-emitting device can be adapted without incurring losses with regard to electro-optic characteristic data operating voltage and light generation efficiency. The n-doped electron transport layer 4.6 is manufactured in a vacuum by means of mixed evaporation from two independently controlled evaporation sources (for matrix material and dopant). The donor molecules in the layers 4.6 and 4.7 can also be molecules of different organic materials.

For all light-emitting devices according to the examples 1 to 4, a minor operating voltage was measured even though no non-high-quality metal was adopted for the cathode contact. A value of 100 cd/m² was obtained in all cases for operating voltage of less than 4 V. The colour of the emitted light was yellow. The LUMO of MEH-PPV lies between −2.8 eV and −2.9 eV. The current efficiencies with MEH-PPV are generally very small. A value of 0.5 cd/A was measured.

FIG. 2 shows a schematic illustration of a light-emitting device 200 in which, on a substrate 21, a light-emitting layer stack 20 in inverted design and light, which is generated in the light-emitting layer stack 20, is formed emitting through the substrate 21. For this purpose, the substrate 21 is transparent for the light generated in the light-emitting layer stack 20.

A cathode contact 22 is arranged according to FIG. 2 on the substrate 21. The cathode contact 22 has a layer thickness between approx. 10 nm and approx. 500 nm. In another design, the layer thickness is between approx. 20 nm and approx. 200 nm. As a material for the cathode contact 22 which is also executed transparent, a degenerated organic semiconductor material, for example indium tin oxide (ITO), or a metal is used, for example Ca, Ba, Au, Ag or Al. A design from a metal alloy can also be envisaged.

A polymer electron injection layer 23 from a polymer material is arranged according to FIG. 2 on the cathode contact 22. The polymer electron injection layer 23 has a layer thickness between approx. 20 nm and approx. 500 nm. In other embodiments the layer thickness is between approx. 40 nm and 150 nm, preferably between approx. 50 nm and approx. 100 nm.

A polymer emission layer 24 from a polymer material is arranged according to FIG. 2 on the polymer electron injection layer 23. The polymer emission layer 24 is transporting for electric charge carriers in the form of electrons, meaning, injected electrons from the polymer injection layer 23 are transported. The polymer emission layer 24 has a layer thickness between approx. 20 nm and approx. 500 nm. In other embodiments, the layer thickness is between approx. 40 nm and approx. 150 nm, preferably between approx. 50 nm and approx. 100 nm. As polymer material, the following materials can be used: polyfluorene, PPVs, polyspiros, polythiophene and polyparaphenylene.

A low-molecular hole-side blocking layer 25 from one or several organic materials is arranged according to FIG. 2 on the polymer emission layer 24. The hole-side blocking layer 25 serves the additional blocking of electric charge carriers in the form of electrons from the polymer emission layer 24. Moreover, exitones from the polymer emission layer 24 are blocked. Furthermore, the hole-side blocking layer 25 fulfils the function of a separation of high charge carrier densities in the form of holes in a low-molecular hole transport layer 26 and high charge carrier densities in the form of electrons in the polymer emission layer 24. The formation of exciplexes is prevented in this way, which would minimise the efficiency of the light-emitting device 200. The hole-side blocking layer 25 has a layer thickness between approx. 2 nm and approx. 50 nm. In other designs the layer thickness is between approx. 5 nm and approx. 30 nm, preferably between approx. 5 nm and approx. 30 nm.

The low-molecular hole transport layer 26 is arranged according to FIG. 2 on the hole-side block layer 25 and formed from one or several organic materials. The low-molecular hole transport layer 26 has a layer thickness between approx. 10 nm and approx. 500 nm. In other designs the layer thickness is between approx. 20 nm and approx. 200 nm, preferably between approx. 20 nm and approx. 100 nm. The low-molecular hole transport layer 26 can be electrically doped with a strong acceptor material from low-molecular acceptor molecules of an organic material. The acceptor molecules are built into an organic matrix material. The molar mass of the acceptor molecules is between approx. 100 g/mol and approx. 200 g/mol, preferably between 200 g/mol and 1000 g/mol. The ratio between acceptor molecules and molecules of the organic matrix material is between 1:1000 and 1:2, preferably between 1:100 and 1:5, more preferably between 1:100 and 1:10.

A low-molecular organic layer 27 from acceptor molecules of an organic material is arranged according to FIG. 2 on the low-molecular hole transport layer 26. The acceptor molecules have, versus Fc/Fc (ferrocene/ferrocenium redox couple), a reduction potential of at least approx. −0.3 V. In other embodiments, the reduction potential is at least approx. 0 V, preferably at least approx. 0.3 V. This molecular property corresponds to a lowest unoccupied molecular orbital (LUMO) of the acceptor molecules of at least 4.5 eV, preferably at least 4.8 eV and more preferably at least 5.1 eV. The molar mass of the acceptor molecules is between approx. 100 g/mol and approx. 2000 g/mol, preferably between approx. 200 g/mol and approx. 1000 g/mol.

According to FIG. 2, an anode contact 28 is arranged on the low-molecular organic layer 27 from the acceptor molecules. The anode contact 28 is reflecting for the light generated in the light-emitting layer stack 20 and has a thickness of at least approx. 10 nm. As material for the anode contact 28, metals are used such as for example Au or Ag, a combination of a metal and a degenerated semiconductor material, ITO for example, or a metal alloy.

In alternative embodiments (not shown) of the light-emitting device 200, single or several layers can be dispensed with, for example the polymer electron injection layer 23, the low-molecular hole-side blocking layer 25 and/or the low-molecular hole transport layer 26.

The embodiment of the light-emitting device shown in FIG. 2 can also be configured alternatively in such a way that the light generated in the light-emitting layer stack 20 is emitted away from the substrate 21. In this embodiment, the cathode contact 22 is reflecting and the anode contact 28 is transparent, for example using a degenerated semiconductor material. A transparent embodiment both of the cathode contact 22 as well as of the anode contact 28 can also be envisaged.

As follows, examples for various designs explained with reference to FIG. 2 are explained in greater detail.

EXAMPLE 5

In an example 5, the light-emitting device has the following configuration, which comprises a low-molecular organic injection layer consisting of acceptor molecules of an organic material:

5.1 transparent substrate (glass)
5.2 cathode contact (indium tin oxide (ITO); 90 nm)
5.4 polymer electron transporting emission layer (C8-polyfluorene (blue emission))
5.7 low-molecular acceptor molecule layer ($C_{14}$DCNQI (N,N'-dicyan-2,3,5,6-tetrachloro-1,4-quinonediimine): 2 nm thick)
5.8 anode contact (reflecting; Ag)

The measured operating voltage was approx. 4 V. However, no good electron injection and no good electron transport was attainable with the available polymer electron transport materials. For this reason, it was not possible to fully utilise the potential of the low-molecular acceptor molecule layer.

EXAMPLE 6

In an example 6, the light-emitting device has the following configuration, which comprises a low-molecular organic injection layer consisting of acceptor molecules of an organic material and a low-molecular organic injection layer consisting of donor molecules:

6.1 transparent substrate (glass)
6.2 anode contact (indium tin oxide (ITO); 90 nm)
6.3 low-molecular acceptor molecule layer ($C_{14}$DCNQI (N,N'-dicyan-2,3,5,6-tetrachloro-1,4-quinonediimine); 2 nm thick)
6.4 polymer hole injection layer, (PEDOT:PSS (Baytron-P of H.C. Starck, Germany); 80 nm thick (spin-coated from watery dispersion)
6.5 polymer hole transporting emission layer (MEH-PPV; 70 nm thick (spin-coated from toluene solution)
6.6 low-molecular donor molecule layer ($W_2(Xpp)_4$; 2 nm thick)
6.7 cathode contact (reflecting; Al)

In the example 6 the injection layer with acceptor molecules is built in as an optional layer additionally to the polymer hole injection layer.

The advantages of the explained embodiments is the fact that a uniform top electrode contact can be used for all light-emitting polymer materials, for example polyfluorene, PPVs, polyspiros, polythiophene and polyparaphenylene, therefore for all emission colours. Furthermore, devices emitting away from the substrate and transparent devices can be efficiently manufactured.

The features of the invention disclosed in the description as given above, in the claims and in the drawing can be significant both individually as well as in any random combination for the realisation of the invention in its various embodiments.

The invention claimed is:

1. A light-emitting device comprising an arrangement of layers on a substrate, wherein the arrangement of layers comprises an anode contact and a cathode contact which are in electrical contact with a light-emitting layer stack, wherein the light-emitting layer stack is arranged between the anode contact and the cathode contact, and the light-emitting layer stack comprises a polymer layer comprising a polymer material, and a first low-molecular layer of vacuum-deposited small molecules of a first organic material that is depositable by means of vacuum evaporation, wherein the first low-molecular layer is arranged adjacent to the cathode contact or the anode contact, and wherein the small molecules of the first low-molecular layer are:
donor molecules with a maximum oxidation potential versus Fc/Fc+ (ferrocene/ferrocenium redox couple) of approximately −1.5 V, if the first low-molecular layer is arranged adjacent to the cathode contact, or
acceptor molecules with a minimum reduction potential versus Fc/Fc+ (ferrocene/ferrocenium redox couple) of approximately −0.3 V, if the first low-molecular layer is arranged adjacent to the anode contact.

2. The device according to claim 1, wherein the light-emitting layer comprises a second low-molecular layer comprising vacuum-deposited small molecules of a second organic material that is separable by means of vacuum evaporation which is different from the first organic material, wherein the small molecules of the second low-molecular layer comprise:
acceptor molecules with a maximum oxidation potential versus Fc/Fc+ (ferrocene/ferrocenium redox couple) of approximately −1.5 V, if the second low-molecular layer is arranged adjacent to the anode contact and the first low-molecular layer is arranged adjacent to the cathode contact, or
donor molecules with a minimum reduction potential versus Fc/Fc+ (ferrocene/ferrocenium redox couple) of approximately −0.3 V, if the second low-molecular layer is arranged adjacent to the cathode contact and the first low-molecular layer is arranged adjacent to the anode contact.

3. The device according to claim 1, wherein the donor molecules have a maximum oxidation potential versus Fc/Fc+ (ferrocene/ferrocenium redox couple) of approximately −2.0 V.

4. The device according to claim 1, wherein the acceptor molecules have a minimum reduction potential versus Fc/Fc+ (ferrocene/ferrocenium redox couple) of approximately 0 V.

5. The device according to claim 1, wherein the donor molecules or the acceptor molecules have a molar mass between approximately 100 g/mol and approximately 2000 g/mol.

6. The device according to claim 1, wherein the donor molecules comprise (tetrakis(1,2,3,3a,4,5,6,6a,7,8-decahydro-1,9,9b-triazaphenalenyl)ditungsten(II).

7. The device according to claim 1, wherein the acceptor molecules comprise (N,N'-dicyano-2,3,5,6-tetrachloro-1,4-quinonediimine).

8. The device according to claim 2, wherein the first low-molecular or the second low-molecular layer have a layer thickness between approximately 0.5 nm and approximately 20 nm.

9. The device according to claim 1, wherein the polymer layer is a light-emitting and charge carrier transporting layer.

10. The device according to claim 1, wherein the polymer layer has a layer thickness between approximately 20 nm and approximately 500 nm.

11. The device according to claim 1, wherein the polymer layer comprises a polymer material selected from the following group of polymer materials: polyfluorenes, poly(p-phenylene vinylene), polyspiros, polythiophenes, or polyparaphenylenes.

12. The device according to claim 1, wherein a polymer hole injection layer is arranged between the anode contact and the polymer layer, if the first low-molecular layer is arranged adjacent to the cathode contact.

13. The device according to claim 12, wherein the polymer hole injection layer has a layer thickness between approximately 50 nm and approximately 100 nm.

14. The device according to claim 1, wherein a low-molecular organic electron transport layer is arranged between the first low-molecular layer and the polymer layer, if the first low-molecular layer is arranged adjacent to the cathode contact.

15. The device according to claim 14, wherein the low-molecular organic electron transport layer comprises an organic matrix material which is electrically doped with a low-molecular organic donor material.

16. The device according to claim 15, wherein the low-molecular organic electron transport layer has a doping concentration (donor material molecules:matrix material molecules) between 1:1000 and 1:2.

17. The device according to claim 15, wherein the organic donor material has a molar mass between approximately 100 g/mol and approximately 2000 g/mol.

18. The device according to claim 14, wherein the low-molecular organic electron transport layer has a layer thickness between approximately 10 nm and approximately 500 nm.

19. The device according to claim 15, wherein the low-molecular organic donor material comprises (tetrakis(1,2,3,3a,4,5,6,6a,7,8-decahydro-1,9,9b-triazaphenalenyl)ditungsten(II).

20. The device according claim 1, wherein a low-molecular organic blocking layer is arranged between the first low-molecular layer and the polymer layer, if the first low-molecular layer is arranged adjacent to the cathode contact.

21. The device according to claim 20, wherein the low-molecular organic blocking layer has a layer thickness between approximately 2 nm and approximately 50 nm.

22. The device according to claim 1, wherein a polymer electron injection layer is arranged between the cathode contact and the polymer layer, if the first low-molecular layer is arranged adjacent to the anode contact.

23. The device according to claim 22, wherein the polymer electron injection layer has a layer thickness between approximately 50 nm and approximately 100 nm.

24. The device according to claim 1, wherein a low-molecular organic hole transport layer is arranged between the first low-molecular layer and the polymer layer, if the first low-molecular layer is arranged adjacent to the anode contact.

25. The device according to claim 24, wherein the low-molecular organic hole transport layer comprises an organic matrix material which is electrically doped with a low-molecular organic acceptor material.

26. The device according to claim 25, wherein the low-molecular organic hole transport layer has a doping concentration (acceptor material molecules:matrix material molecules) between 1:1000 and 1:2.

27. The device according to claim 25, wherein the organic acceptor material has a molar mass between approximately 200 g/mol and approximately 1000 g/mol.

28. The device according to claim 24, wherein the low-molecular organic hole transport layer has a layer thickness between approximately 10 nm and approximately 500 nm.

29. The device according to claim 25, wherein the low-molecular organic acceptor material is (N,N'-dicyano-2,3,5,6-tetrachloro-1,4-quinonediimine).

30. The device according to claim 1, wherein a low-molecular organic blocking layer is arranged between the first low-molecular layer and the polymer layer, if the first low-molecular layer is arranged adjacent to the anode contact.

31. The device according to claim 30, wherein the low-molecular organic blocking layer has a layer thickness between approximately 2 nm and approximately 50 nm.

32. The device according to claim 1, wherein the arrangement of layers is arranged according to at least one configuration selected from the following group of configurations: inverted configuration; non-inverted configuration; configuration having light which is generated in the light-emitting layer stack emitting away from the substrate ("top-emission"); or configuration having light which is generated in the light-emitting layer stack emitting through the substrate ("bottom emission").

33. The device according to claim 1, wherein the arrangement of layers and the substrate is transparent.

34. The device according to claim 1, wherein the anode contact or the cathode contact comprise: one or several metals, a combination of a metal and a degenerate semiconductor material, or a metal alloy.

* * * * *